United States Patent
Gonzalez et al.

(10) Patent No.: US 9,590,132 B2
(45) Date of Patent: Mar. 7, 2017

(54) SYSTEMS AND METHODS FOR CASCADING PHOTOVOLTAIC STRUCTURES

(71) Applicant: SolarCity Corporation, San Mateo, CA (US)

(72) Inventors: Pablo Gonzalez, Fremont, CA (US); Bobby Yang, Los Altos Hills, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/866,776

(22) Filed: Sep. 25, 2015

(65) Prior Publication Data

US 2016/0163909 A1    Jun. 9, 2016

Related U.S. Application Data

(60) Provisional application No. 62/088,509, filed on Dec. 5, 2014, provisional application No. 62/143,694, filed on Apr. 6, 2015.

(51) Int. Cl.
| | |
|---|---|
| B25B 11/00 | (2006.01) |
| H01L 31/18 | (2006.01) |
| H01L 31/05 | (2014.01) |

(52) U.S. Cl.
CPC ........ *H01L 31/188* (2013.01); *H01L 31/0504* (2013.01); *Y02E 10/50* (2013.01)

(58) Field of Classification Search
CPC .... B25B 11/005; B25B 11/007; B23B 31/307
See application file for complete search history.

(56) References Cited

U.S. PATENT DOCUMENTS

| | | | |
|---|---|---|---|
| 2,938,938 A | 5/1960 | Dickson, Jr. | |
| 3,116,171 A | 12/1963 | Nielsen et al. | |

(Continued)

FOREIGN PATENT DOCUMENTS

| | | |
|---|---|---|
| DE | 4030713 A1 | 4/1992 |
| EP | 1 816 684 A2 | 8/2007 |

(Continued)

OTHER PUBLICATIONS

Floedl, H. et al., "Komplexe Herstellverfahren und Hochleistungsstrukturen für kostengünstige kristalline Silicium-Dünnschicht-Solarzellen," (English translation: "Complex methods of production and high efficiency structures for cost-effective crystalline thin-film silicon solar cells Final report"), Forschungsbericht. Bundesministerium für Forschung und Technologie (BMFT), Dec. 1992, Germany, retrieved from the Internet on Oct. 12, 2015, from http://www.opengrey.eu/item/display/10068/200783?lang=en (Abstract Only), 2 pages.

(Continued)

*Primary Examiner* — Lee D Wilson
(74) *Attorney, Agent, or Firm* — Kilpatrick Townsend & Stockton LLP

(57) ABSTRACT

A string-forming system is described. The string-forming system may include at least a first cell-lifting mechanism and a second cell-lifting mechanism that can automatically arrange a set of strips of a photovoltaic structure into a cascaded formation. During operation, a controller can cause the first cell-lifting mechanism to lift a first strip from a first platform, and can cause the second cell-lifting mechanism to lift, from the first platform, a second strip that may follow the first strip on the first platform. The controller may then activate a first shifting actuator of the first cell-lifting mechanism or a second shifting actuator of the second (Continued)

cell-lifting mechanism to place a leading edge of the second strip above a trailing edge of the first strip.

20 Claims, 16 Drawing Sheets

(56) References Cited

U.S. PATENT DOCUMENTS

| | | | |
|---|---|---|---|
| 3,459,597 A | | 8/1969 | Baron |
| 4,420,361 A | * | 12/1983 | Valimont .......... B32B 17/10954 156/556 |
| 4,561,541 A | | 12/1985 | Lawrence |
| 4,577,051 A | | 3/1986 | Hartmann |
| 4,652,693 A | | 3/1987 | Bar-On |
| 4,877,460 A | | 10/1989 | Flödl |
| 5,000,655 A | * | 3/1991 | Pate .................... F27D 3/0021 198/463.4 |
| 5,118,361 A | | 6/1992 | Fraas et al. |
| 5,178,685 A | | 1/1993 | Borenstein et al. |
| 6,232,545 B1 | | 5/2001 | Samaras et al. |
| 6,303,853 B1 | | 10/2001 | Fraas et al. |
| 6,441,297 B1 | | 8/2002 | Keller et al. |
| 6,538,193 B1 | | 3/2003 | Fraas |
| 6,620,645 B2 | | 9/2003 | Chandra et al. |
| 6,803,513 B2 | | 10/2004 | Beernink et al. |
| 6,841,728 B2 | | 1/2005 | Jones et al. |
| 7,310,865 B2 | * | 12/2007 | Cole ..................... B25B 11/007 269/21 |
| 7,328,534 B2 | | 2/2008 | Dinwoodie |
| 7,388,146 B2 | | 6/2008 | Fraas et al. |
| 7,635,810 B2 | | 12/2009 | Luch |
| 7,749,883 B2 | | 7/2010 | Meeus |
| 7,772,484 B2 | | 8/2010 | Li et al. |
| 7,777,128 B2 | | 8/2010 | Montello et al. |
| 7,825,329 B2 | | 11/2010 | Basol |
| 7,829,781 B2 | | 11/2010 | Montello et al. |
| 7,829,785 B2 | | 11/2010 | Basol |
| 7,872,192 B1 | | 1/2011 | Fraas et al. |
| 7,872,193 B2 | | 1/2011 | Ogawa et al. |
| 8,024,854 B2 | | 9/2011 | Lu et al. |
| 8,168,880 B2 | | 5/2012 | Jacobs |
| 8,196,798 B2 | | 6/2012 | Luechinger et al. |
| 8,209,920 B2 | | 7/2012 | Krause et al. |
| 8,222,513 B2 | | 7/2012 | Luch |
| 8,253,009 B2 | | 8/2012 | Reinisch |
| 8,343,795 B2 | | 1/2013 | Luo et al. |
| 8,469,345 B2 | * | 6/2013 | Samac .................... B23Q 3/06 269/21 |
| 8,586,857 B2 | | 11/2013 | Everson et al. |
| 8,657,991 B2 | | 2/2014 | Potter et al. |
| 8,796,541 B2 | | 8/2014 | Iwade et al. |
| 8,847,063 B2 | | 9/2014 | Terreau et al. |
| 2002/0050672 A1 | * | 5/2002 | Moncavage ........... B23Q 1/035 269/266 |
| 2003/0000571 A1 | | 1/2003 | Wakuda et al. |
| 2003/0121228 A1 | | 7/2003 | Stoehr et al. |
| 2003/0201007 A1 | | 10/2003 | Fraas et al. |
| 2005/0257823 A1 | | 11/2005 | Zwanenburg |
| 2007/0283997 A1 | | 12/2007 | Hachtmann et al. |
| 2007/0294883 A1 | | 12/2007 | Napetschnig |
| 2009/0097956 A1 | * | 4/2009 | Landes ................. B65G 47/90 414/788.3 |
| 2010/0037932 A1 | | 2/2010 | Erez et al. |
| 2010/0043863 A1 | | 2/2010 | Wudu et al. |
| 2010/0147364 A1 | | 6/2010 | Gonzalez et al. |
| 2010/0193014 A1 | | 8/2010 | Johnson et al. |
| 2010/0218799 A1 | | 9/2010 | Stefani |
| 2010/0224230 A1 | | 9/2010 | Luch et al. |
| 2011/0065226 A1 | | 3/2011 | Luo et al. |
| 2011/0156188 A1 | | 6/2011 | Tu et al. |
| 2011/0239450 A1 | | 10/2011 | Basol et al. |
| 2011/0259419 A1 | | 10/2011 | Hagemann et al. |
| 2012/0000502 A1 | | 1/2012 | Wiedeman et al. |
| 2012/0040487 A1 | | 2/2012 | Asthana et al. |
| 2012/0049430 A1 | * | 3/2012 | Aceti .................... B23Q 3/088 269/21 |
| 2012/0060911 A1 | | 3/2012 | Fu et al. |
| 2012/0080508 A1 | | 4/2012 | Schultz et al. |
| 2012/0125391 A1 | | 5/2012 | Pinarbasi et al. |
| 2012/0152349 A1 | | 6/2012 | Cao et al. |
| 2012/0240995 A1 | | 9/2012 | Coakley |
| 2012/0248497 A1 | | 10/2012 | Zhou et al. |
| 2012/0279548 A1 | | 11/2012 | Münch et al. |
| 2012/0318319 A1 | | 12/2012 | Pinarbasi et al. |
| 2012/0318340 A1 | | 12/2012 | Heng et al. |
| 2012/0325282 A1 | | 12/2012 | Snow et al. |
| 2013/0095578 A1 | | 4/2013 | Baccini et al. |
| 2013/0096710 A1 | | 4/2013 | Pinarbasi et al. |
| 2013/0113156 A1 | * | 5/2013 | Keller .................. B65H 3/0883 271/42 |
| 2013/0122616 A1 | | 5/2013 | Degroot et al. |
| 2013/0122639 A1 | | 5/2013 | Degroot et al. |
| 2013/0136565 A1 | * | 5/2013 | Amsden .............. B25J 15/0052 414/191 |
| 2013/0152996 A1 | | 6/2013 | DeGroot et al. |
| 2013/0206213 A1 | | 8/2013 | He et al. |
| 2013/0206221 A1 | | 8/2013 | Gannon et al. |
| 2013/0272833 A1 | | 10/2013 | Duncan et al. |
| 2014/0115894 A1 | * | 5/2014 | Gamboa .............. B62D 57/024 29/897.2 |
| 2014/0124013 A1 | | 5/2014 | Morad et al. |
| 2014/0124014 A1 | | 5/2014 | Morad et al. |
| 2014/0196768 A1 | | 7/2014 | Heng et al. |
| 2014/0352777 A1 | | 12/2014 | Hachtmann et al. |
| 2014/0353894 A1 | * | 12/2014 | DesJardien ............. B23P 19/10 269/21 |
| 2014/0373892 A1 | | 12/2014 | Bergmann et al. |
| 2015/0076214 A1 | | 3/2015 | Kodama et al. |
| 2015/0090314 A1 | | 4/2015 | Yang et al. |
| 2015/0270410 A1 | | 9/2015 | Heng et al. |
| 2015/0349145 A1 | | 12/2015 | Morad et al. |
| 2015/0349153 A1 | | 12/2015 | Morad et al. |
| 2015/0349161 A1 | | 12/2015 | Morad et al. |
| 2015/0349162 A1 | | 12/2015 | Morad et al. |
| 2015/0349167 A1 | | 12/2015 | Morad et al. |
| 2015/0349168 A1 | | 12/2015 | Morad et al. |
| 2015/0349169 A1 | | 12/2015 | Morad et al. |
| 2015/0349170 A1 | | 12/2015 | Morad et al. |
| 2015/0349171 A1 | | 12/2015 | Morad et al. |
| 2015/0349172 A1 | | 12/2015 | Morad et al. |
| 2015/0349173 A1 | | 12/2015 | Morad et al. |
| 2015/0349174 A1 | | 12/2015 | Morad et al. |
| 2015/0349175 A1 | | 12/2015 | Morad et al. |
| 2015/0349176 A1 | | 12/2015 | Morad et al. |
| 2015/0349190 A1 | | 12/2015 | Morad et al. |
| 2015/0349193 A1 | | 12/2015 | Morad et al. |
| 2015/0349701 A1 | | 12/2015 | Morad et al. |
| 2015/0349702 A1 | | 12/2015 | Morad et al. |
| 2015/0349703 A1 | | 12/2015 | Morad et al. |
| 2016/0163909 A1 | * | 6/2016 | Gonzalez ............ H01L 31/0504 29/25.01 |

FOREIGN PATENT DOCUMENTS

| | | |
|---|---|---|
| EP | 2362430 A1 | 8/2011 |
| EP | 2 340 556 B1 | 8/2012 |
| WO | 2008089657 A1 | 7/2008 |
| WO | 2013020590 A1 | 2/2013 |
| WO | 2013068982 A1 | 5/2013 |
| WO | 2014074826 A2 | 5/2014 |
| WO | 2014/124495 A1 | 8/2014 |
| WO | 2015/106170 A2 | 7/2015 |
| WO | 2015/183827 A2 | 12/2015 |

OTHER PUBLICATIONS

International Search Report mailed on Mar. 10, 2016, for International Patent Application No. PCT/US2015/064138, 5 pages.

(56) References Cited

OTHER PUBLICATIONS

Written Opinion mailed on Mar. 10, 2016 for International Patent Application No. PCT/US2015/064138, 8 pages.

* cited by examiner

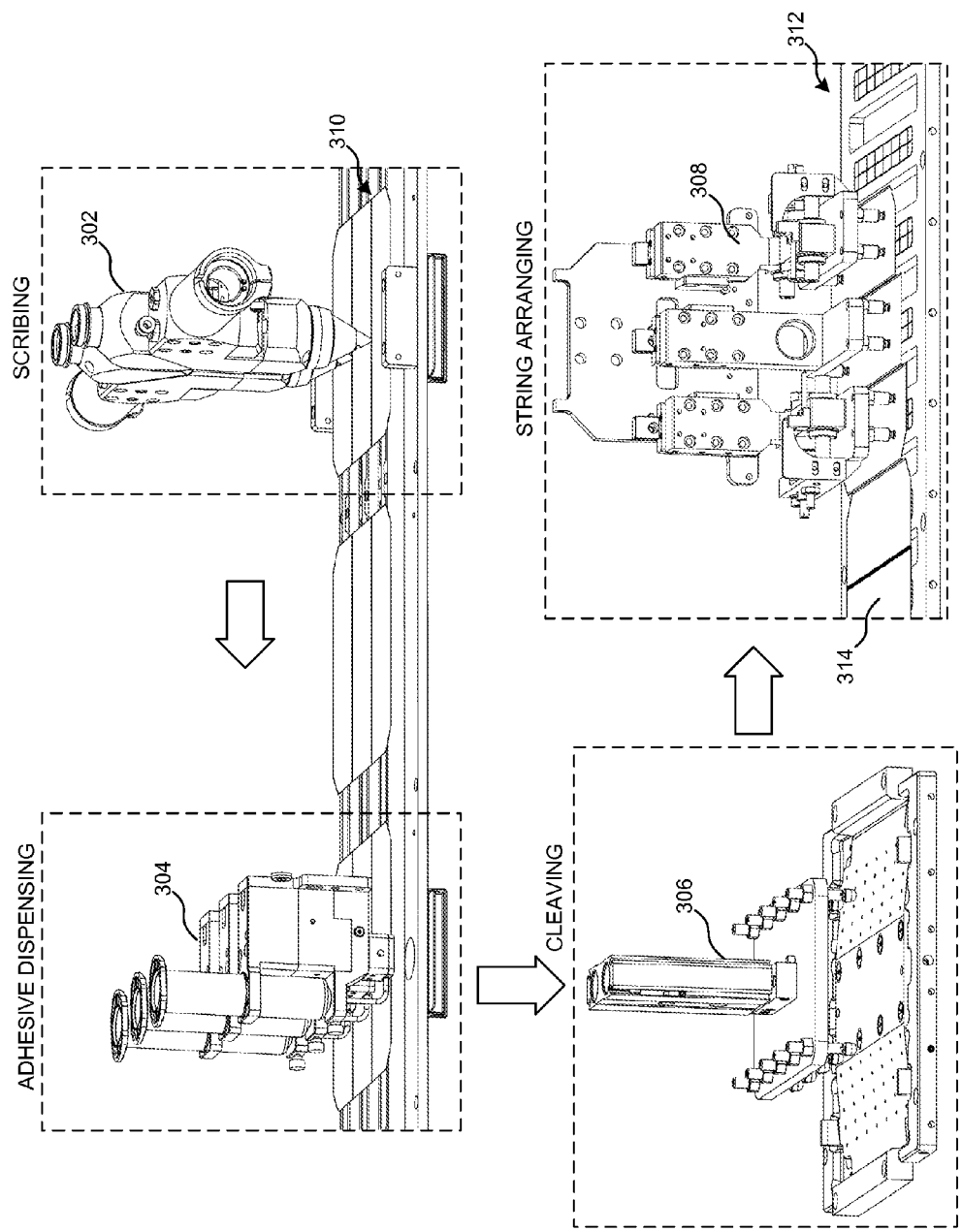

US 9,590,132 B2

SYSTEMS AND METHODS FOR CASCADING PHOTOVOLTAIC STRUCTURES

CROSS-REFERENCE TO OTHER APPLICATIONS

This claims the benefit of U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015; the disclosures of which are incorporated herein by reference in their entirety for all purposes.

This is related to U.S. patent application Ser. No. 14/563,867, entitled "HIGH EFFICIENCY SOLAR PANEL," filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014; the disclosures of which are incorporated herein by reference in their entirety for all purposes.

FIELD OF THE INVENTION

This relates to solar panel fabrication, including cascading solar cells to facilitate automated manufacturing of solar panels.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014 and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

One method of making such a panel includes sequentially connecting the busbars of adjacent cells and combining them. One type of panel (as described in the above-noted patent application) includes a series of cascaded strips created by dividing complete solar cells into strips, and then cascading the strips to form one or more strings.

Precise and consistent division of solar cells into strips and alignment of strips or cells when forming a cascade arrangement is critical to ensure proper electrical and physical connections, but such alignment can be difficult to reliably achieve in high volumes if performed manually.

SUMMARY

Embodiments of the invention are directed to systems and methods for precision automation of cascaded panel assembly by utilizing automated electro-mechanical systems that act in concert to manufacture cascaded solar panels.

Several embodiments are described to allow one of ordinary skill in the art to appreciate the general subject matters that this specification covers. For ease of reading, not every possible variation and/or embodiment is covered in this section. Therefore, this summary should not be construed to limit the scope of the invention.

One embodiment of the invention provides a string-forming system that can automatically arrange a set of strips into a cascaded formation. The string-forming system can include a controller that can control a number of actuators and mechanical systems. During operation, the controller can activate a first lifting actuator of a first cell-lifting mechanism so that the first cell-lifting mechanism may lift a first strip from a first platform. The controller may also activate a second lifting actuator of a second cell-lifting mechanism so that the second cell-lifting mechanism may lift, from the first platform, a second strip that may follow the first strip on the first platform. The controller may then activate a first shifting actuator of the first cell-lifting mechanism or a second shifting actuator of the second cell-lifting mechanism to place a leading edge of the second strip above a trailing edge of the first strip, while moving the first and second strips toward a second platform.

In a variation of this embodiment, the second strip can overlap the first strip by approximately two millimeters.

In a variation of this embodiment, the first and second cell-lifting mechanisms may each include at least one suction cup that can maintain a suction-hold on a strip.

In a variation of this embodiment, the first cell-lifting mechanism can lift the first strip to a first elevation, and the second cell-lifting mechanism can lift the second strip to a second elevation that may be higher than the first elevation.

In a variation of this embodiment, the controller can activate the first and second lifting actuators so that they may rest the first and second strip on the second platform, where the leading edge of the second strip may be placed above the trailing edge of the first strip.

In a variation of this embodiment, when placing the leading edge of the second strip above the trailing edge of the first strip, the controller can activate the first shifting actuator to move the first cell-lifting mechanism toward the second cell-lifting mechanism and place the first strip under the second strip.

In a variation of this embodiment, when placing the leading edge of the second strip above the trailing edge of the first strip, the controller can activate the second shifting actuator to move the second cell-lifting mechanism toward the first cell-lifting mechanism and place the second strip over the first strip.

BRIEF DESCRIPTION OF THE FIGURES

FIG. 3 shows a sequence of steps for processing photovoltaic structures to produce a string, according to one embodiment of the invention.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

A string-forming system is provided that automatically arranges multiple photovoltaic structure strips into a cascaded arrangement that forms a string, without significantly damaging the photovoltaic structures. The string-forming system can operate within an automated assembly line that can manufacture complete solar panels that may include multiple strings of cascaded strips.

The string-forming system can obtain strips from a cleaving table, and in some embodiments, can arrange these strips into a cascaded arrangement while transporting the strips toward a flat surface that is to hold the string, such as an annealing platform. If a string of cascaded strips are resting on the flat surface, the string-forming system can extend the string by placing the new cascaded strip arrangement near the trailing end of the string. Later stages of the solar-panel assembly line may combine multiple of these strings to produce a solar panel.

Figure 1A:
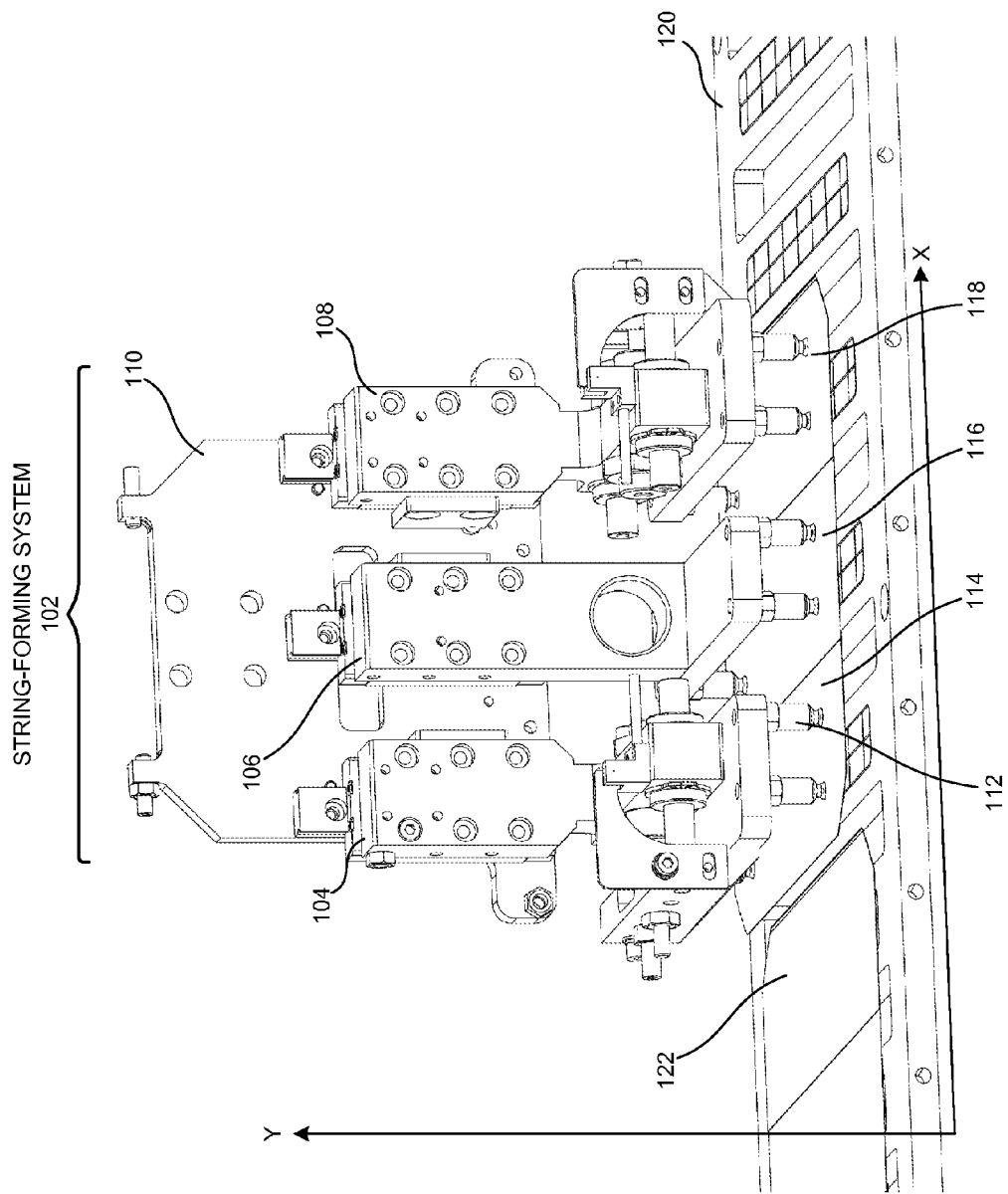
FIG. 1A shows a string-forming system, according to one embodiment of the invention.

FIG. 1A illustrates a string-forming system 102, according to one embodiment of the invention. String-forming system 102 can include one or more mechanical arms that can lift and move strips. For example, mechanical arms 104, 106, and 108 can each include a set of suction cups (e.g., suction cup 112) that can hold onto a strip by applying a suction force on a surface of the strip (e.g., an upward-facing surface of strips 114, 116, and 118). The suction force allows the strip to attach to the suction cups. Using suction cups can obviate the need for mechanical clamps, which could damage the strip's electrodes and/or photovoltaic structure. In some embodiments, the suction may be applied to the base layer of the strip (e.g., the upward-facing layer of strips 114, 116, and 118) to avoid applying forces to the strip's thin emitter layer. This allows string-forming system 102 to prevent causing significant damage to the strip's emitter layer.

Mechanical arms 104, 106, and 108 can be mounted on a mount 110 that can slide laterally along a rail (not shown), for example, to move strips 114, 116, and 118 from a holding tray to annealing platform 120. In some embodiments, mount 110 can also be coupled to an actuator (not shown) that can conform string-forming system 102 to a target elevation, such as by raising or lowering string-forming system 102 to an elevation near the holding tray. This can allow string-forming system 102 to raise mechanical arms 104, 106, and 108 to a sufficient height to pick up a set of strips from the holding tray that may be elevated above annealing platform 120. It will be understood by those skilled in the art that although FIG. 1A shows an annealing platform 120 as the surface that holds the cells, any surface may be used instead of an annealing platform.

Mechanical arms 104, 106, and 108 can each include a set of actuators that allow the mechanical arm to move a strip along an X and/or Y axis independent of strips held by the other mechanical arms. For example, mechanical arm 106 can include an actuator that can lift center strip 116, and mechanical arms 104 and 108 can include actuators that can lift and shift side strips 114 and 118, respectively. Once strips 114, 116, and 118 are above their target resting position along the X axis, mechanical arms 104, 106, and 108 can lower the strips along the Y axis to rest them on platform 120. The strips' final resting position can have strip 114 overlap a trailing edge of strip 122 by a sufficient distance that can cause their busbars to overlap, such as by approximately 2 mm.

In one variation, the actuators that move mechanical arms 104, 106, and 108 may be electric motors, which can be activated by a set of electronic motor controllers. In another variation, the actuators may be pneumatic or hydraulic actuators. String-forming system 102 can include a set of pneumatic or hydraulic pumps that can generate the air or fluid pressure necessary for moving each actuator to a target position. String-forming system 102 can also include a set of hoses (not shown) for transferring the air or fluid pressure to the actuators on mechanical arms 104, 106, and 108.

Figure 1B:
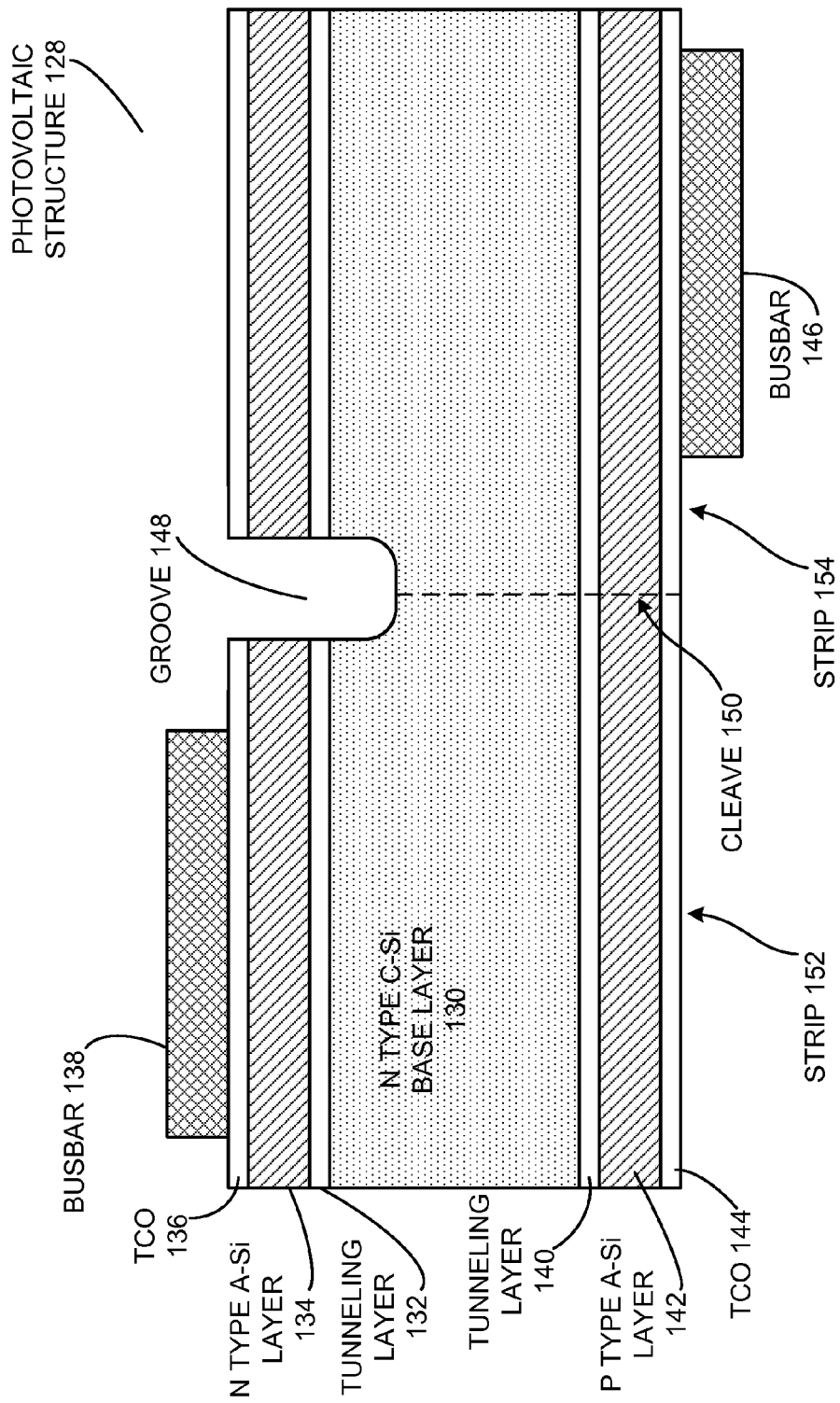
FIG. 1B shows one example of a photovoltaic structure before being divided into multiple strips, according to an embodiment of the invention.

FIG. 1B shows one example of a photovoltaic structure before being divided into multiple strips, according to one embodiment of the invention. Photovoltaic structure 128 in this example can include N type lightly doped crystalline silicon (c-Si) base layer 130, intrinsic tunneling layer 132, N type heavily doped amorphous silicon (a-Si) surface field layer 134, transparent conductive oxide (TCO) layer 136, and front-side busbar 138. On the backside, the structure can include intrinsic tunneling layer 140, P type a-Si emitter layer 142, TCO layer 144, and backside busbar 146. The backside tunneling junction, formed by P type a-Si emitter layer 140, intrinsic tunneling layer 140, and N type c-Si base layer 130, can transport away the majority carriers generated by base layer 130. The front side tunneling junction, formed by N type heavily doped a-Si surface field layer 134, intrinsic tunneling layer 132, and base layer 130, can transport away the minority carriers generated by base layer 130, thereby reducing the amount of carrier recombination in base layer 130. Tunneling layers 132 and 140 can passivate the interface between base layer 130 and the two heavily doped a-Si layers while still allowing carriers generated by base layer 130 to enter these a-Si layers due to tunneling effect.

The tunneling junction between base layer 130 and emitter layer 142 is where the majority carriers are removed. It is therefore preferable that damage to this interface is kept small, such as damage caused by scribing groove 148, handling photovoltaic structure 128, or cleaving photovoltaic structure 128 along groove 148 to produce strips 152 and 154 (e.g., by producing cleave 150). For example, any impact made to the downward-facing surface of strips 152 and 154 can create scratches or micro cracks along TCO layer 144, a-Si layer 142, and/or tunneling layer 140. It is therefore preferable to lift strips 152 and 154 by using a set of suction cups that apply a suction force on the top surface of strips 152 and 154 (e.g., on TCO 136). More details of an exemplary photovoltaic structure are provided in U.S. patent application Ser. No. 13/601,441, filed Aug. 31, 2012, entitled "BACK JUNCTION SOLAR CELL WITH TUNNEL OXIDE," the disclosure of which is hereby incorporated by reference in its entirety herein.

Exemplary photovoltaic structure 128 shown in FIG. 1B includes an N type lightly doped c-Si base layer. In general, the base layer can be either N or P type doped, or undoped, and can be made of a variety of materials, including c-Si, a-Si, poly-crystalline silicon, or non-silicon materials. Various device structures and designs based on different materials can also be used to construct the photovoltaic structure. For example, the photovoltaic structure can be a wafer-based photovoltaic structure, or a thin film photovoltaic structure, which might have a size and shape different from those of regular wafers. Preferred embodiments of the present invention provide a system that can assemble strips 152 and 154 in a cascaded arrangement without causing significant damage to busbars 138 and 146, or to the interface between the base layer and emitter layer. Specifically, when strips 152 and 154 are in a cascaded arrangement, busbar 146 of strip 154 can make electrical contact with busbar 138 of strip 152. A conductive paste can bind busbars 138 and 146 together to hold the cascaded arrangement.

Some conventional solar panels include a single string of serially connected un-cleaved photovoltaic structures. As described in U.S. patent application Ser. No. 14/563,867, it can be more desirable to have multiple (such as 3) strings, each string including cascaded strips, and connect these strings in parallel. Such a multiple-parallel-string panel configuration provides the same output voltage with a reduced internal resistance. In general, a photovoltaic structure can be divided into n strips, and a panel can contain n strings, each string having the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string (note that the total resistance of a string made of a number of strips can be a fraction of the total resistance of a string made of the same number of undivided photovoltaic structures). Therefore, in general, the greater n is, the lower the total internal resistance of the panel is, and the more power one can extract from the panel. However, a tradeoff is that as n increases, the number of connections required to inter-connect the strings also increases, which increases the amount of contact resistance. Also, the greater n is, the more strips a single photovoltaic structure needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance is, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, conventional silver-paste or aluminum based electrode may require n to be greater than 4, because the process of screen printing and firing silver paste onto a photovoltaic structure does not produce ideal resistance between the electrode and the underlying photovoltaic structure. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n is selected to be three, which is less than the n value generally needed for photovoltaic structures with silver-paste electrodes or other types of electrodes. Correspondingly, two grooves can be scribed on a single photovoltaic structure to allow it to be divided to three strips.

In addition to lower contact resistance, electro-plated copper electrodes can also offer better tolerance to micro cracks, which may occur during a cleaving process. Such micro cracks might adversely impact silver-paste-electrode photovoltaic structures. Plated-copper electrode, on the other hand, can preserve the conductivity across the surface of the photovoltaic structure even if there are micro cracks in the photovoltaic structure. The copper electrode's higher tolerance for micro cracks allows one to use thinner silicon wafers to manufacture the photovoltaic structures. As a result, the grooves to be scribed on a photovoltaic structure can be shallower than the grooves scribed on a thicker wafer, which in turn helps increase the throughput of the scribing process. More details on using copper plating to form low-resistance electrode on a photovoltaic structure are provided in U.S. patent application Ser. No. 13/220,532, filed Aug. 29, 2011, entitled "SOLAR CELL WITH ELECTROPLATED GRID," the disclosure of which is incorporated by reference in its entirety.

Figure 1C:
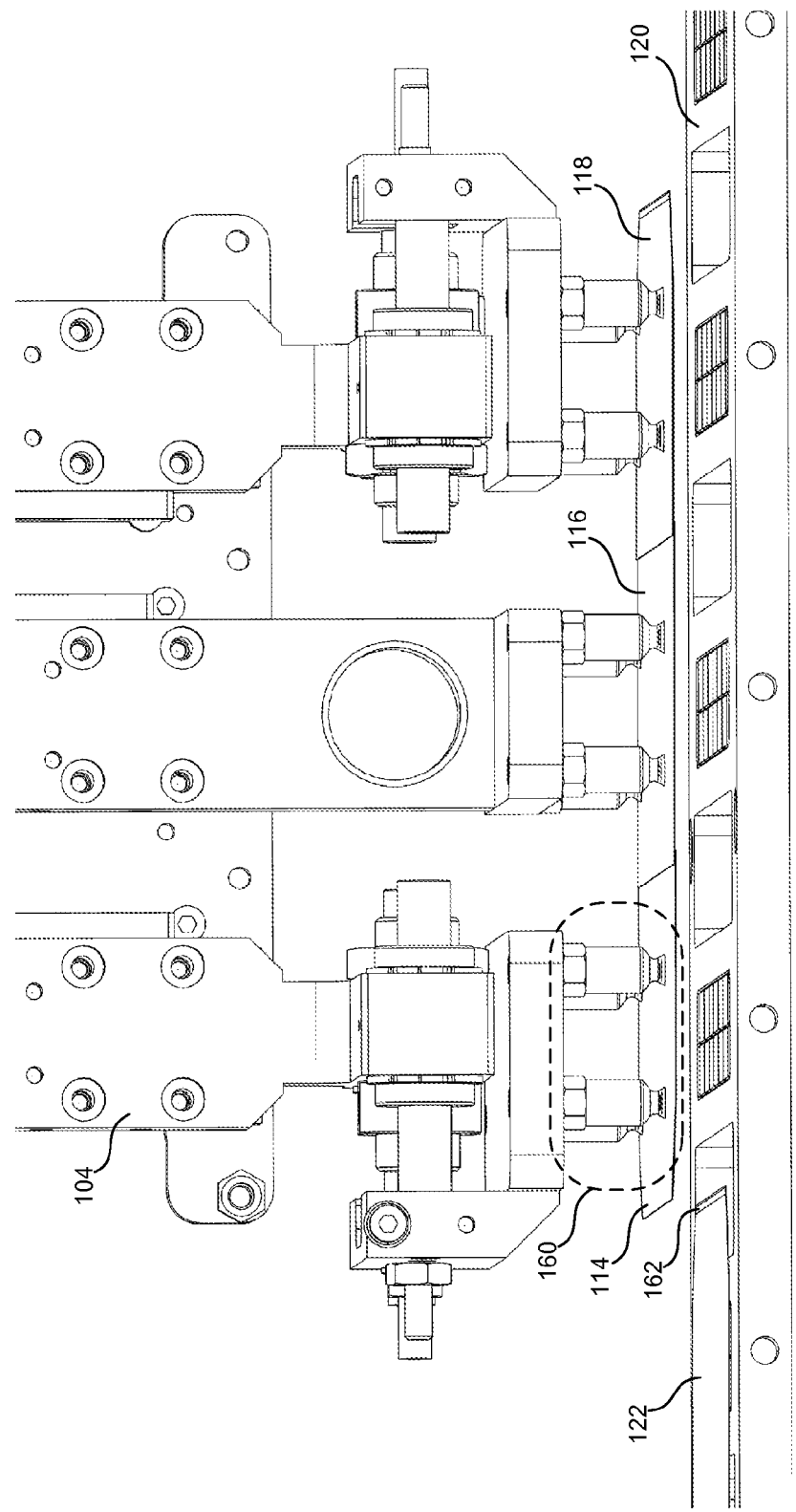
FIG. 1C shows a close-up view of suction cups lifting a set of cascaded strips, according to one embodiment of the invention.

FIG. 1C shows a close-up view of suction cups lifting a set of cascaded strips, according to one embodiment of the invention. Each mechanical arm can include a number of suction cups that together can distribute sufficient suction force across the top surface of a strip to lift the strip. For example, mechanical arm 104 may include at least three suction cups that each can apply suction to a different point along the top surface of strip 114. In some embodiments, mechanical arm 104 can include four suction cups (e.g., suction cups 160), which can be arranged in two parallel rows with two suction cups per row to provide a near-equal suction force near each corner of an elongated strip.

String-forming system 102 can rest strips 114, 116, and 118 on platform 120 in a cascaded arrangement, so that a busbar on the bottom surface of strip 114 comes in electrical contact with busbar 162 on a top surface of strip 122. For example, recall that strip 122 can have a conductive paste deposited along busbar 162. This conductive paste may be an adhesive that can bond strip 114 and strip 122 together to resist separation, and can also have conductive properties that can allow an electric current to flow between busbar 162 and the busbar on the bottom surface of strip 114 via the conductive paste.

In some embodiments, the busbar on strip 114 can be soldered to busbar 162. However, one technical advantage in connecting the busbars via a conductive paste is that it can allow the string to be more flexible. Once deployed, solar panels can go through "thermal cycling" during a 24-hour period as the temperature changes throughout the day. The thermal cycling can exert pressure on the structure of the cascaded strips. The conductive paste can allow the string to withstand the structural stress that may be caused by the thermal cycling.

In some embodiments, the busbars may have an internal channel that can form a recessed surface inside the busbars, and can act as a receptacle to house a viscous adhesive. In some other embodiments, the busbars may have several grooves that may be formed via a mask at the time the busbar is formed on the surface of the photovoltaic structure. Each set of grooves can be placed on a location within the busbar where the fingers intersect the busbar. Each of the grooves can act as a receptacle that can contain the conductive paste. When the two strips are "cascaded," the channels and/or grooves inside each busbar can form a housing that may keep the conductive paste within the boundary of the busbars, and may prevent an overflow from the sides.

Figure 2A:
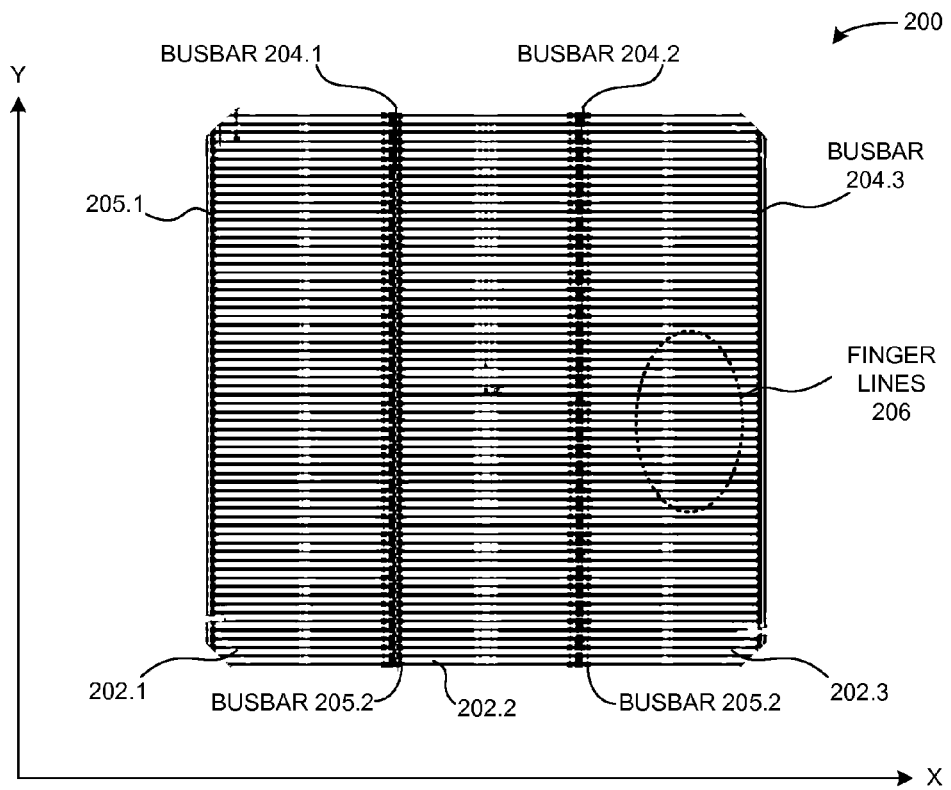
FIG. 2A shows a photovoltaic structure, according to one embodiment of the invention.

FIG. 2A shows photovoltaic structure 200, according to one embodiment of the invention. Photovoltaic structure 200 can include three photovoltaic strips 202.1, 202.2, and 202.3, which can be the result of photovoltaic structure 200 having an electroplated copper electrode that exhibits low contact resistance. Each strip can include a number of substantially parallel finger lines, such as finger lines 206, arranged in the X direction. These finger lines can collect the carriers generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 202.1 can have busbar 204.1 on the top surface, and busbar 205.1 on the bottom surface. Similarly, strip 202.2 can have busbars 204.2 and 205.2 on the top and bottom surfaces, respectively, and strip 202.3 can have busbars 204.3 and 205.3 on the top and bottom surfaces, respectively. In one embodiment, photovoltaic structure 200 can be scribed near and along busbars 204.1 and 204.2, which allows photovoltaic structure 200 to be subsequently cleaved into three strips along these grooves. Additional busbars may be added to either surface to reduce resistance.

Figure 2B:
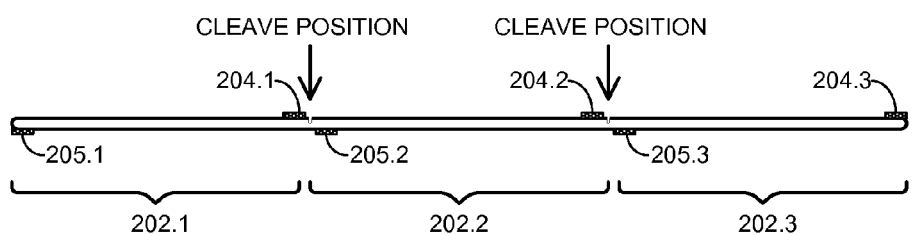
FIG. 2B shows a cross-sectional view of a photovoltaic structure prior to being cleaved, according to one embodiment of the invention.

FIG. 2B shows a cross-sectional view of photovoltaic structure 200 prior to being cleaved, according to one embodiment of the invention. Two scribed grooves can be located between busbars 204.1 and 205.2, and between busbars 204.2 and 205.3, respectively. These grooves correspond to the cleave positions. After the subsequent cleaving process, the entire photovoltaic structure can be divided, for example, to three strips 202.1, 202.2, and 202.3.

Figure 2C:
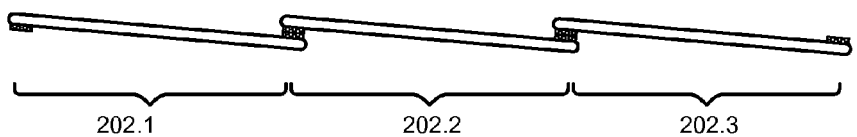
FIG. 2C shows a cascaded arrangement of three strips after a photovoltaic structure is cleaved, according to one embodiment of the invention.

FIG. 2C shows a cascaded arrangement of three strips after a photovoltaic structure is cleaved, according to one embodiment of the invention. In this example, three strips 202.1, 202.2, and 202.3 can be arranged in a cascaded manner, such that the positive-side busbar of one strip overlaps and is electrically coupled to the negative-side busbar of the neighboring strip. A conductive paste can be applied between two facing busbars to facilitate both low-resistance contact and physical bonding. Because no conductive tabs or wires are used, such a cascading arrangement can reduce the series resistance due to inter-connection between to strips, and can improve the fill-factor of the panel.

Figure 2D:
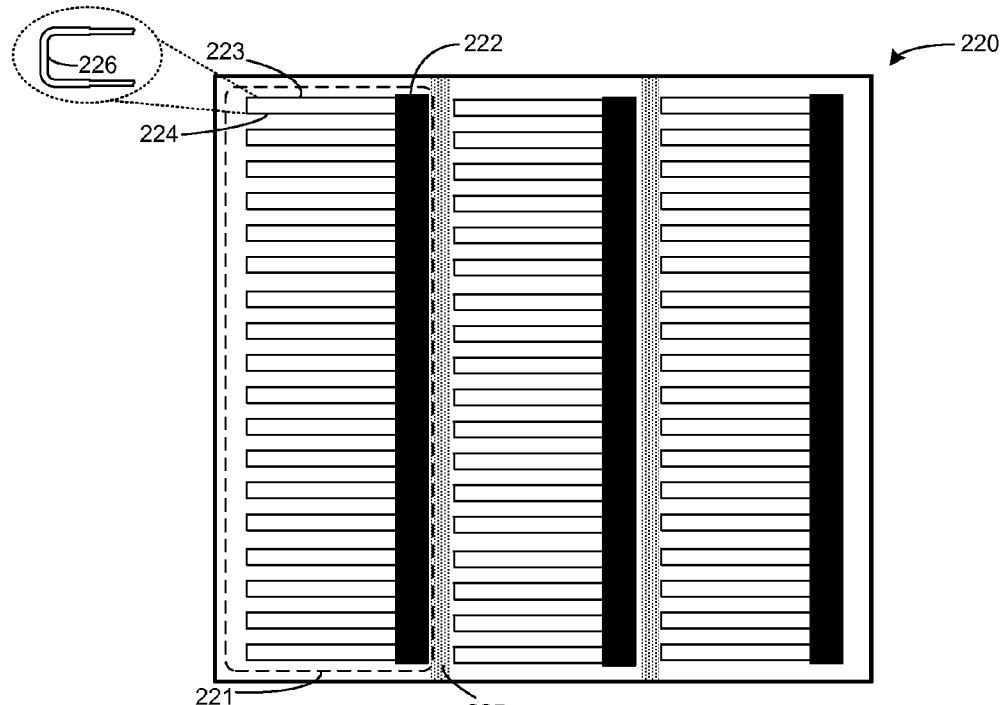
FIG. 2D shows an exemplary conductive grid and blank space pattern on the front surface of a photovoltaic structure, according to one embodiment.

FIG. 2D shows an exemplary conductive grid and blank space pattern on the front surface of a photovoltaic structure, according to one embodiment of the invention. In the example shown in FIG. 2D, conductive grid 220 can be made of any electrically conductive material, including metallic and non-metallic materials. Conductive grid 220 can include three sub-grids, such as sub-grid 221. The photovoltaic structure can also include a blank space (i.e., space not covered by electrodes) between neighboring sub-grids, such as blank space 225. The blank space provides the area where scribing and cleaving can occur. Because the blank space is not covered with any conductive material, the scribing and cleaving can occur without contacting the electrode. Each sub-grid can function as the front-side grid for the corresponding strip. Hence, this sub-grid-and-blank-space configuration can allow the photovoltaic structure to be divided into three strips. In general, a respective sub-grid can have various types of patterns. For example, a sub-grid can have two, instead of one, busbars, or a single busbar placed in the center of the strip. In the example shown in FIG. 2D, the sub-grids can each have a single busbar pattern placed on the edge, which allows the strips to be cascaded.

Figure 2E:
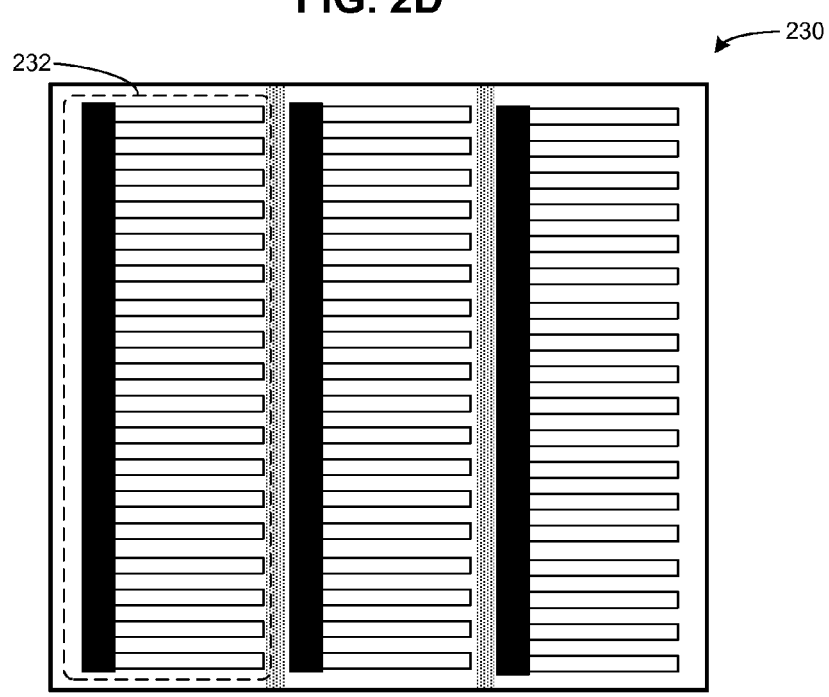
FIG. 2E shows an exemplary conductive grid and blank space pattern on the back surface of a photovoltaic structure, according to one embodiment of the invention.

FIG. 2E shows an exemplary conductive grid and blank space pattern on the back surface of a photovoltaic structure, according to one embodiment of the invention. In this example, back conductive grid 230 can include three sub-grids. In one embodiment, the back side sub-grids may correspond to the front side sub-grids. As a result, the back side of the strips can also absorb light to generate electrical energy, thereby allowing the solar panel to operate in a bifacial manner. In the embodiment shown in FIGS. 2D and 2E, the front and back side sub-grids can have similar patterns except that the front and back edge-busbars are located near opposite edges of the strip. In other words, the busbar on the front side of the strip may be located near one edge, and the busbar on the back side may be located near the opposite edge. In addition, the locations of the blank spaces on the back side may be aligned with the locations of the blank spaces on the front side, such that the conductive grid lines may not interfere with the subsequent cleaving process.

In the embodiment shown in FIGS. 2D and 2E, each sub-grid may include an edge-busbar running along the longer edge of the corresponding strip and a plurality of parallel finger lines running in a direction substantially parallel to the shorter edge of the strip. For example, in FIG. 2D, sub-grid 221 may include edge-busbar 222, and a number of finger lines, such as finger lines 223 and 224. A blank space, which is not covered by any conductive material, can be placed between two adjacent sub-grids to facilitate the subsequent scribe and cleaving process. Note that in FIG. 2D the ends of the finger lines can be connected by a conductive line to form "loops." This type of "looped" finger line pattern can reduce the likelihood of the finger lines from peeling away from the photovoltaic structure after a long period of usage. For example, as shown in FIG. 2D, finger lines 223 and 224 are connected by conductive line 226 to form a loop with rounded corners. Optionally, the sections where the finger lines are joined can be wider than the rest of the finger lines to provide more durability and prevent peeling. Other finger line patterns, such as un-looped straight lines or loops with different shapes, are also possible.

As shown in FIG. 2D, strip-shaped blank space 225, shown in a shaded rectangle, can separate sub-grid 221 from its adjacent sub-grid. The width of the blank space, such as blank space 225, is chosen to provide sufficient area for the scribing process (e.g., using a laser scribe system) without causing significant damage to the nearby electrodes, and yet sufficiently narrow so that the electrodes can reach the edge of each strip and provide low-resistance collection of the carriers. There may be a tradeoff between a wider blank space that facilitates more error-tolerant scribing operation and a narrower blank space that results in more effective current collection. In one embodiment, the blank space width can be between 0.5 mm and 2 mm. In a further embodiment, the width of such a blank space may be 1 mm.

Figure 2F:
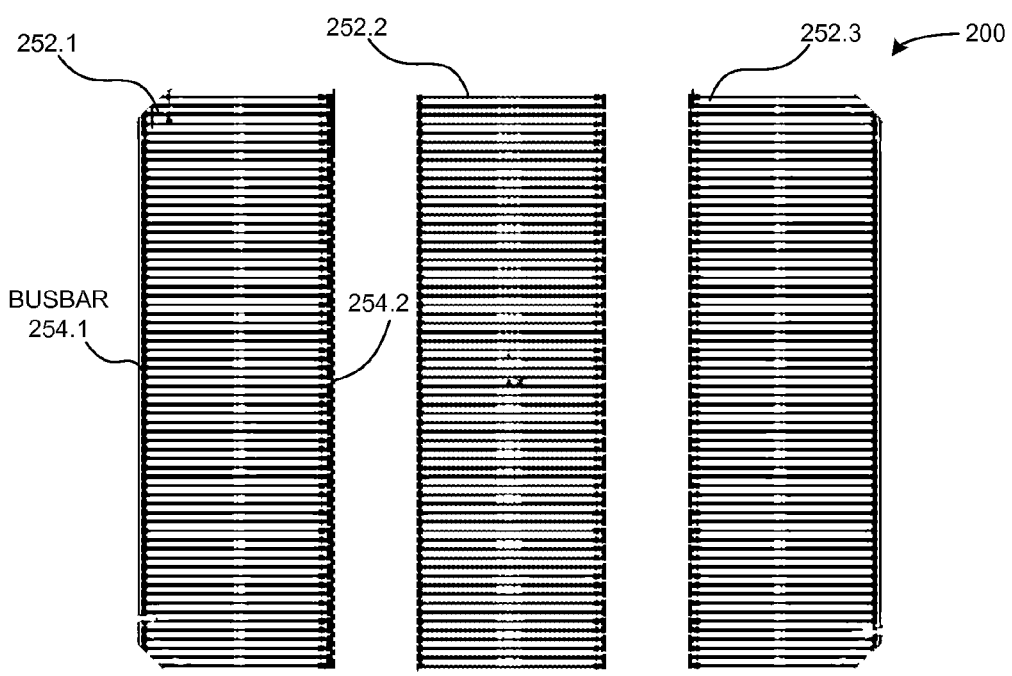
FIG. 2F shows multiple strips, which are the result of separating a photovoltaic structure along a set of grooves, according to one embodiment of the invention.

As mentioned above, in order to prevent damaging the emitter junction of the photovoltaic structure, the scribing operation may be performed on the surface corresponding to the surface field layer. For example, if the emitter junction is on the front side of the photovoltaic structure, the scribing may occur to the back surface of the photovoltaic structure. On the other hand, if the emitter junction is on the back side, the scribing may occur on the front surface of the photovoltaic structure. FIG. 2F shows multiple strips 252.1, 252.2, and 252.3, which are the result of separating a photovoltaic structure along a set of grooves, according to one embodiment of the invention. Each strip can include two busbars, one on each side, on opposite edges. For example, strip 252.1 can include separate busbars 254.1 and 254.2 on the front side and back side, respectively.

Stringy-Forming System

FIG. 3 shows a sequence of steps for processing photovoltaic structures to produce a string, according to one embodiment of the invention. In this example, conveyor 310 can move photovoltaic structures to scribing system 302, which can scribe one or more grooves along the busbars of each photovoltaic structure. Conveyor 310 can then move the photovoltaic structures to adhesive-dispensing system 304, which can dispense a conductive adhesive paste on busbars of the strips, so that after cleaving these strips can be bonded together in a cascaded arrangement.

After application of the conductive adhesive paste, the photovoltaic structures can be picked up from conveyor 310 by, for example, a robotic arm (not shown) via a suction device that may be integrated into the robotic arm. The robotic arm can hold the photovoltaic structure by maintaining the suction force while moving the photovoltaic structure toward cleaving system 306. The robotic arm can rotate photovoltaic structures approximately 90 degrees before placing it onto a loading system of cleaving system 306. The loading system may also include a buffer where the photovoltaic structures can be stored before being moved to cleaving system 306.

Cleaving system 306 can receive photovoltaic structures from the loading system, and can divide the photovoltaic structures into strips along the grooves formed by scribing tool 302. After a photovoltaic structure is divided into a number of (e.g., three) strips, string-arrangement system 308 can lift these strips and arrange the strips in a cascaded arrangement while moving the strips to annealing platform 312. String-arrangement system 308 can overlap a leading edge of the three cascaded strips over the trailing edge of string 314, thereby extending string 314.

The sequence of operations shown in FIG. 3 is one of many ways to manufacture cascaded strings. For example, the step of applying the conductive adhesive paste can occur before scribing or after cleaving. Furthermore, a variety of apparatuses and systems can be used to implement the functions showing in FIG. 3.

Figure 4:
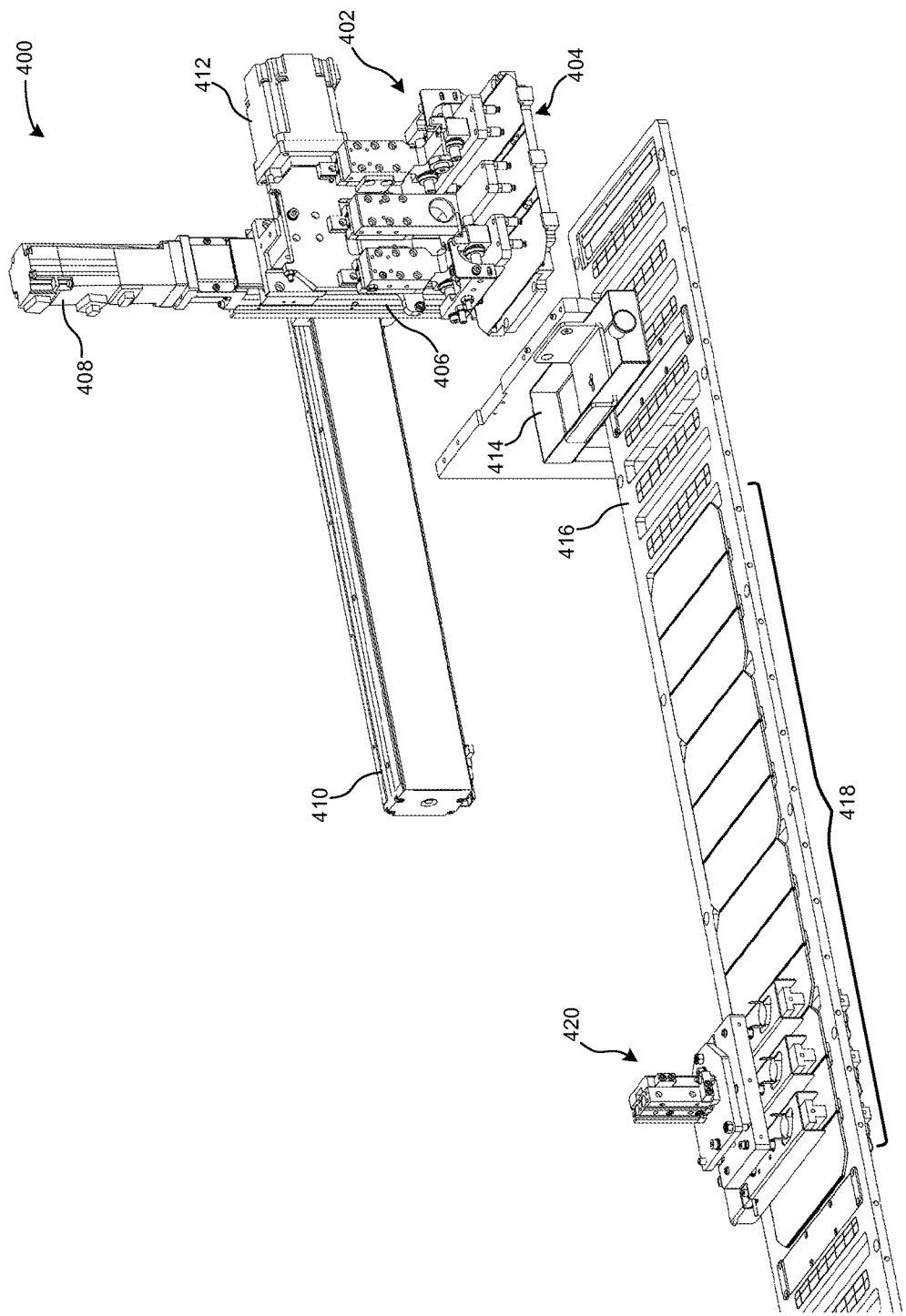
FIG. 4 shows a string-generating lane, according to one embodiment of the invention.

FIG. 4 shows string-generating lane 400, according to one embodiment of the invention. String-forming system 402 can pick up a set of strips from holding tray 404, and determines whether these strips have passed an electrical test. For example, holding tray 404 may reside on a cleaving table that can include a cleaving apparatus, and can include a testing apparatus that may test electrical properties of the strips to determine whether they have become damaged during or prior to the cleaving process. If any of the strips fail the test, string-forming system 402 can discard the entire photovoltaic structure (e.g., the three strips) by depositing the strips into disposal tray 414.

In some embodiments, string-forming system 402 can test electrical properties of the strips while the strips are on holding tray 404, or while moving the strips toward annealing platform 416. For example, each mechanical arm can have a probe that can apply a predetermined voltage to a busbar on the strip being tested, and the same probe or another probe can perform current measurements to test the strip. A defective strip can then be identified based on the current measured by the probes. A strip may be considered defective if a measured current through the strip is less than a predetermined minimum current, which can occur when micro cracks form along the busbars or when the photovoltaic structure may have become damaged.

In one variation, the strips may be placed on a grounded surface (e.g., holding tray 404) that can make contact with another busbar on the strip (e.g., a busbar on a bottom surface of the strip). The electrical current may flow from the busbar on the top surface of the strip toward the other busbar, and to the grounded surface. In another variation, each mechanical arm may also include a grounded probe that can ground another busbar of the strip (e.g., another busbar on a top surface or bottom surface of the strip). In this variation, the mechanical arm can test the strip while moving the cascaded strip toward annealing platform 416.

If the strips pass the test, string-forming system 402 can lift, shift and align the strips to form a cascaded strip assembly, and can place the cascaded strip assembly on annealing platform 416 to form or extend string 418. For example, string-forming system 402 can be mounted on rail 406, and rail 406 can itself be mounted on another rail 410. To pick up strips from holding tray 404, actuator 412 can move string-forming system 402 (e.g., laterally) along rail 410 toward holding tray 404, and actuator 408 can move (e.g., raise) string-forming system 402 along rail 406 so that its suction cups are elevated above holding tray 404. String-forming system 402 can then pick up the strips by gently lowering its mechanical arms toward the strips, and activating a pump to create a suction force at the suction cups.

Once the strips are secured to a bottom surface of the suction cups, actuator 408 and/or the actuators for the mechanical arms on string-forming system 402 can raise the strips above holding tray 404. Actuator 412 can then move string-forming system 402 along rail 410 toward a target location on platform 416, and actuator 408 can conform string-forming system 402 to platform 416, such as by lowering it until the strips are substantially close to platform 416. String-forming system 402 can then extend string 420, for example, by overlapping one busbar of the cascaded strip arrangement with another busbar near the trailing end of string 418.

In some variations, string-forming system 402 can create the cascaded strip arrangement while moving the strips toward their target resting position on platform 416. Alternatively, string-forming system 402 can move each individual strip toward platform 416, one strip at a time, such as by lowering the strips to create the cascaded strip arrangement while forming or extending string 418 one strip at a time.

In some embodiments, annealing platform 416 can move (e.g., laterally) to pass string 418 between two heat-treating surfaces of targeted annealing apparatus 420, which may apply heat to the areas of string 418 where two strips overlap. Targeted annealing apparatus 420 may include a set of heat-treating bars that each can have a contact surface that may be substantially flat. In some embodiments, the heat-treating bars may be arranged as a set of bars above and a set of bars below platform 416. String 418 can be placed on the surface, which may have a series of openings that may allow the heat-treating bars to contact the string from under the surface. The heat-treating bars can be positioned such that as they may approach the string, they may apply heat to the both sides of the string around the area where two strips overlap. In some embodiments, the heat-treating bars can cure the overlapping areas of the strips up to 160° Celsius. The heat can cause the paste in between two overlapping busbars to cure.

In some embodiments, the conductive paste may be in a form of a resin that can include one or more types of conductive particles. The conductive particles may be coated with a protection layer that can evaporate when the paste is thermally cured, and can thereby result in electrical conductivity between the conductive particles suspended inside the resin.

Figure 5:
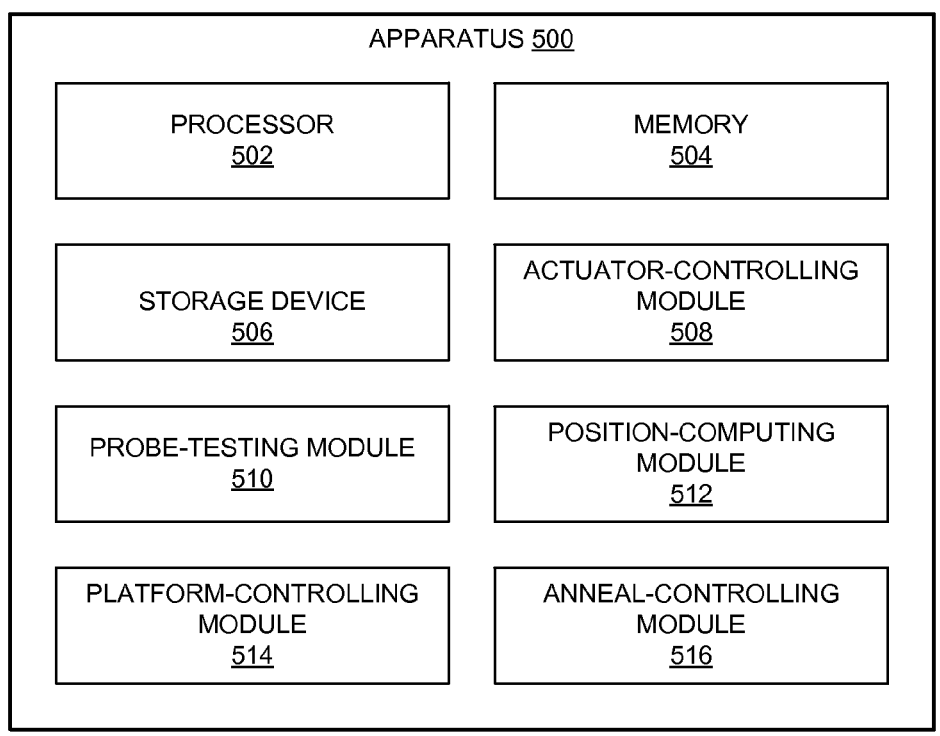
FIG. 5 shows an exemplary control apparatus, according to one embodiment of the invention.

FIG. 5 shows exemplary control apparatus 500, according to one embodiment of the invention. Apparatus 500 can include a computer-based or electronic control system that can operate a string-forming system to create and extend a string of cascaded strips. For example, apparatus 500 can include a plurality of modules which may communicate with one another via a wired or wireless communication channel. Apparatus 500 may be realized using one or more integrated circuits, and may include fewer or more modules than those shown in FIG. 5. Further, apparatus 500 may be integrated in a computer system, or realized as a separate mechanism which may be capable of communicating with other computer systems and/or mechanisms.

Apparatus 500 can include processor 502, memory 504, and storage device 506. Memory 504 can include a volatile memory (e.g., RAM) that serves as a managed memory, and can be used to store one or more memory pools. In some embodiments, storage device 506 can store an operating system, and instructions for monitoring and controlling the string-generating process.

Apparatus 500 can also include actuator-controlling module 508, probe-testing module 510, position-computing module 512, platform-controlling module 514, and anneal-controlling module 516. Actuator-controlling module 508 can activate a set of actuators on a mechanical arm to move the mechanical arm to a strip-holding tray on a cleaving table. Probe-testing module 510 can perform a probe test on strips, using a set of test probes on the cleaving table and/or on the mechanical arm. If a strip fails the probe test, actuator-controlling module 508 can operate the mechanical arm to move the strips to a discard tray. Otherwise, actuator-controlling module 508 can operate the mechanical arm to transport the strips toward an annealing platform that may have a cascaded string on a top surface.

Position-computing module 512 can periodically re-compute an updated position of the cascaded string and/or the individual strips with respect to a fixed point on the string-generating lane, while the platform moves the string toward the lay-up station. For example, position-computing module 512 can calculate the position of a strip on a mechanical arm based on a position of the string-forming system along a rail, and a position of the mechanical arm's suction cups relative to the string-forming system. Also, position-computing module 512 can calculate the position of a strip on the annealing platform based on an image captured by a vision system, a corresponding time stamp, and the speed of the platform.

Platform-controlling module 514 can activate a set of actuators that can cause the platform surface to move the cascaded string toward a lay-up station that combines multiple strings of cascaded strips to form a solar panel. Anneal-controlling module 516 can control a set of heat-treating bars to perform targeted annealing along the contact surfaces between cascaded strips to cause a conductive paste to anneal.

Figure 6:
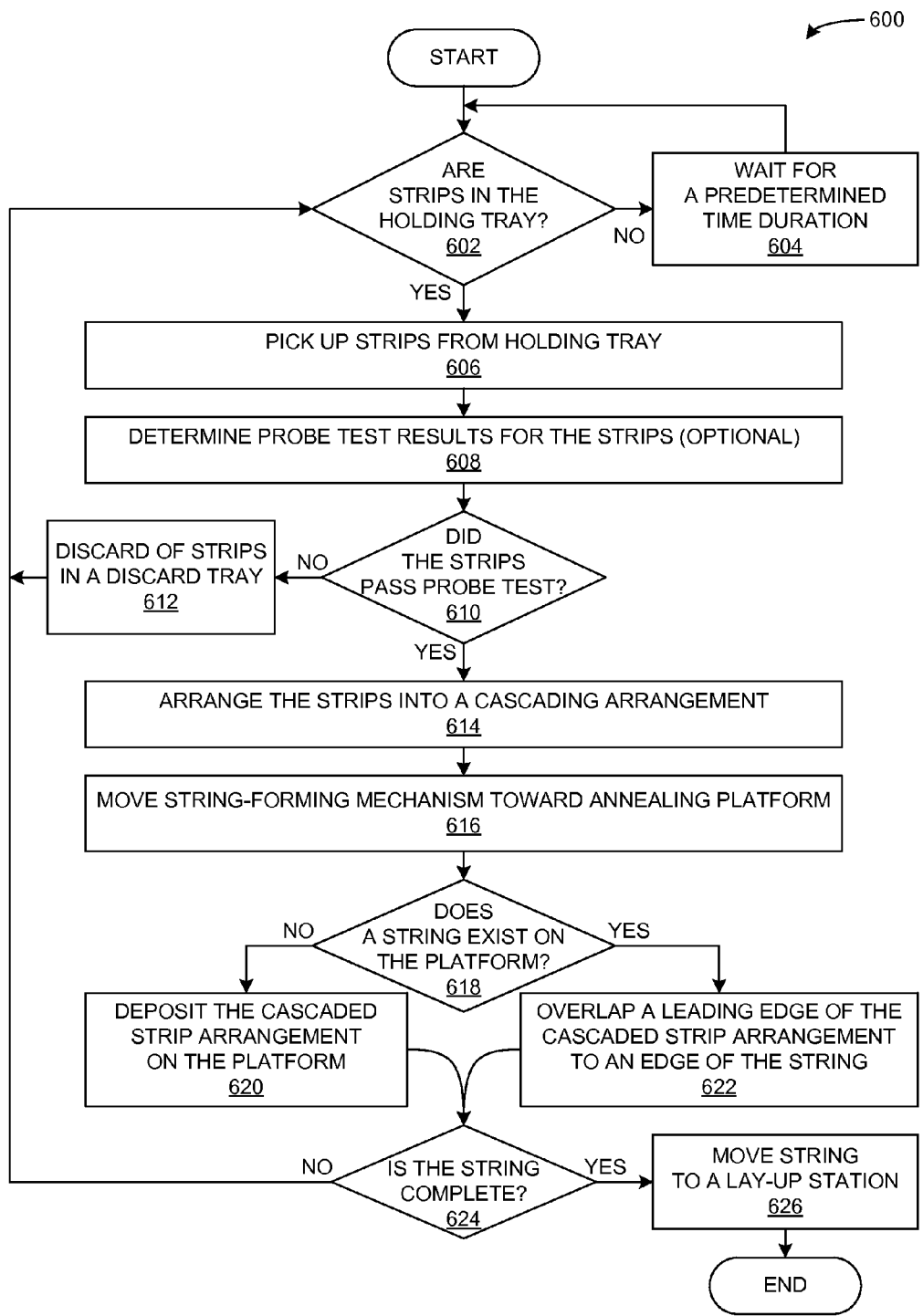
FIG. 6 presents a flow chart illustrating a method for arranging strips in a cascaded arrangement to form a string, according to one embodiment of the invention.

FIG. 6 presents a flow chart illustrating method 600 for arranging strips in a cascaded arrangement to form a string, according to one embodiment of the invention. During operation, a computer system that controls the string-forming system can determine whether there are any strips in a holding tray of the cleaving table (operation 602). If there are no strips in the tray, the computer system can wait for a predetermined duration (operation 604) before returning to operation 602 to check the holding tray.

On the other hand, if strips exist in the tray, the computer system can control the string-forming system to pick up the strips from the holding tray (operation 606), and can optionally determine probe test results for the strips (operation 608). Recall that in some embodiments, the cleaving table can include a probe tester that tests various electrical properties of the individual strips. In some other embodiments, the string-forming system can include a set of test probes that can perform the test on the individual strips either while the strips rest on the holding tray, or after picking up the strips from the holding tray.

If the computer system determines that the strips did not pass the probe test (operation 610), the computer system can configure the string-forming system to move the strips toward a discard tray, and to discard of the strips in the discard tray (operation 612). In some embodiments, during operation 606, the computer system can cause the string-forming system to pick up the strips, for example, by activating a suction pump to create a negative air pressure on a set of suction cups. This negative air pressure can create a suction hold on a top surface of a strip, which can press the strip against a bottom surface of the suction cups. To discard the strips in the discard tray, the computer system can deactivate the negative air pressure for the suction cups that hold a given strip when the strip is elevated above the discard tray, and/or can activate a pressure pump to cause a positive airflow at the suction cups.

Otherwise, if the strips have passed the probe test, the computer system can operate the string-forming system to arrange the strips into a cascading arrangement (operation 614), and can move the string-forming system toward an annealing platform (operation 616) either simultaneously or as a separate operation.

The computer system can also determine whether a partial string exists on the platform (operation 618). If a partial string does not exist, the computer system can operate the string-forming system to deposit the cascaded strip arrangement (which is being carried by the string-forming system) onto the platform to start a new string (operation 620). Otherwise, the computer system can operate the string-forming system to overlap a leading busbar of the cascaded strip arrangement with a trailing busbar of the string on the platform (operation 622).

The computer system may then determine whether the string on the platform may be complete (operation 624). If the string has not reached a target length or does not include a target number of strips, the computer system can return to operation 602 to add one or more strips to the string's cascaded arrangement. Otherwise, the computer system can activate the platform to move the string toward a lay-up station (operation 626), and the process can end. In some embodiments, the computer system can cause the platform to move the string toward the lay-up station while performing operations 602-624 to from the string. Moreover, while moving the string toward the lay-up station, the platform can move the string through a targeted-annealing apparatus that can heat the string around the areas where two strips overlap to cure conductive paste between the overlapping strips.

Figure 7A:
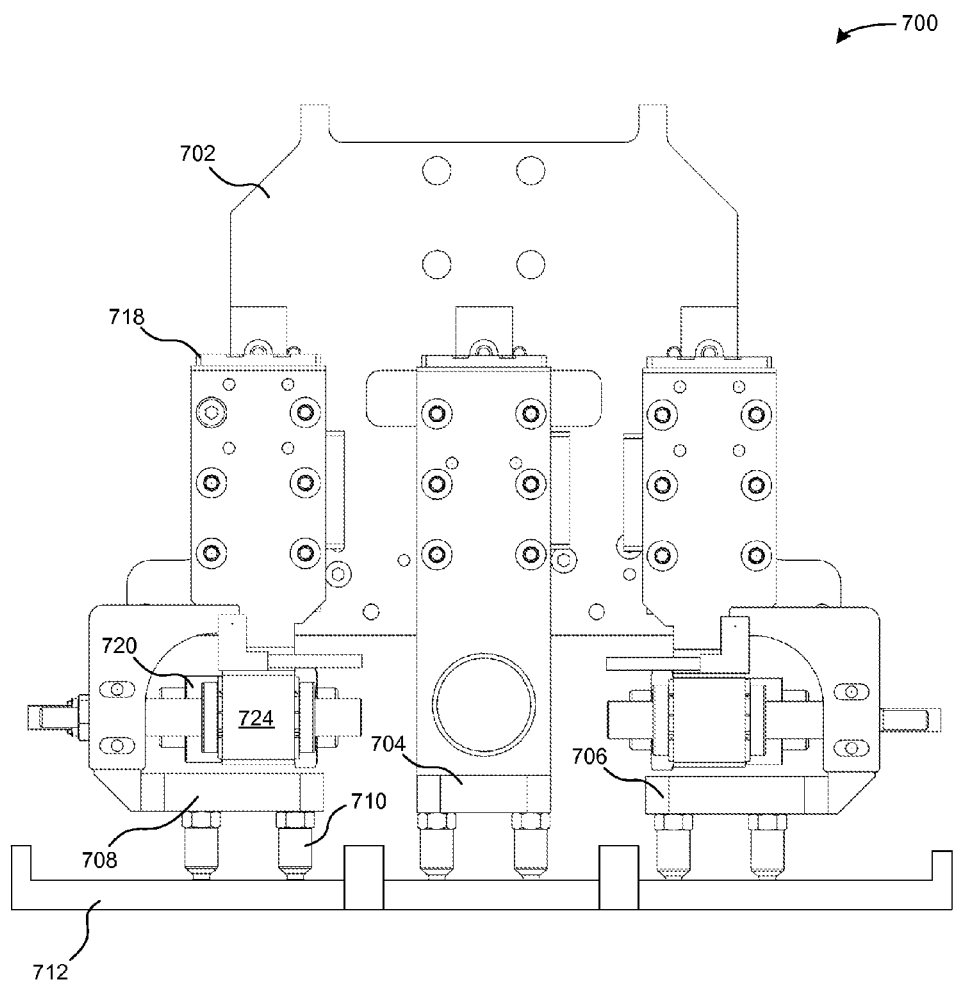
FIG. 7A shows a string-forming system, according to one embodiment of the invention.

FIG. 7A shows string-forming system 700, according to one embodiment of the invention. String-forming system 700 can include mechanical arm 708 on the left side, mechanical arm 706 on the right side, and mechanical arm 704 in between mechanical arms 706 and 708. Each mechanical arm can have one or more suction cups 710, which may lift a strip from holding tray 712 (e.g., an output tray from a cleaving table).

In one embodiment, each of the mechanical arms may be capable of moving in the vertical direction and/or in the horizontal direction. Each mechanical arm can lift the strips from tray 712 via the suction cups that apply a holding force to the surface of the strips. The suction cups can have a matching elevation to distribute the holding force evenly across the top surface of the strips, which can prevent causing significant damage to the strips. For example, the even holding force across a strip's surface can prevent warping the strip due to torsion, which would otherwise damage the strip's photovoltaic structure or could damage the copper busbars or fingerlines across the surface of the strip. A respective mechanical arm can lift the strip it is holding to a predetermined elevation, and as a result, may create a cascaded formation (e.g., a stepped formation).

Figure 7B:
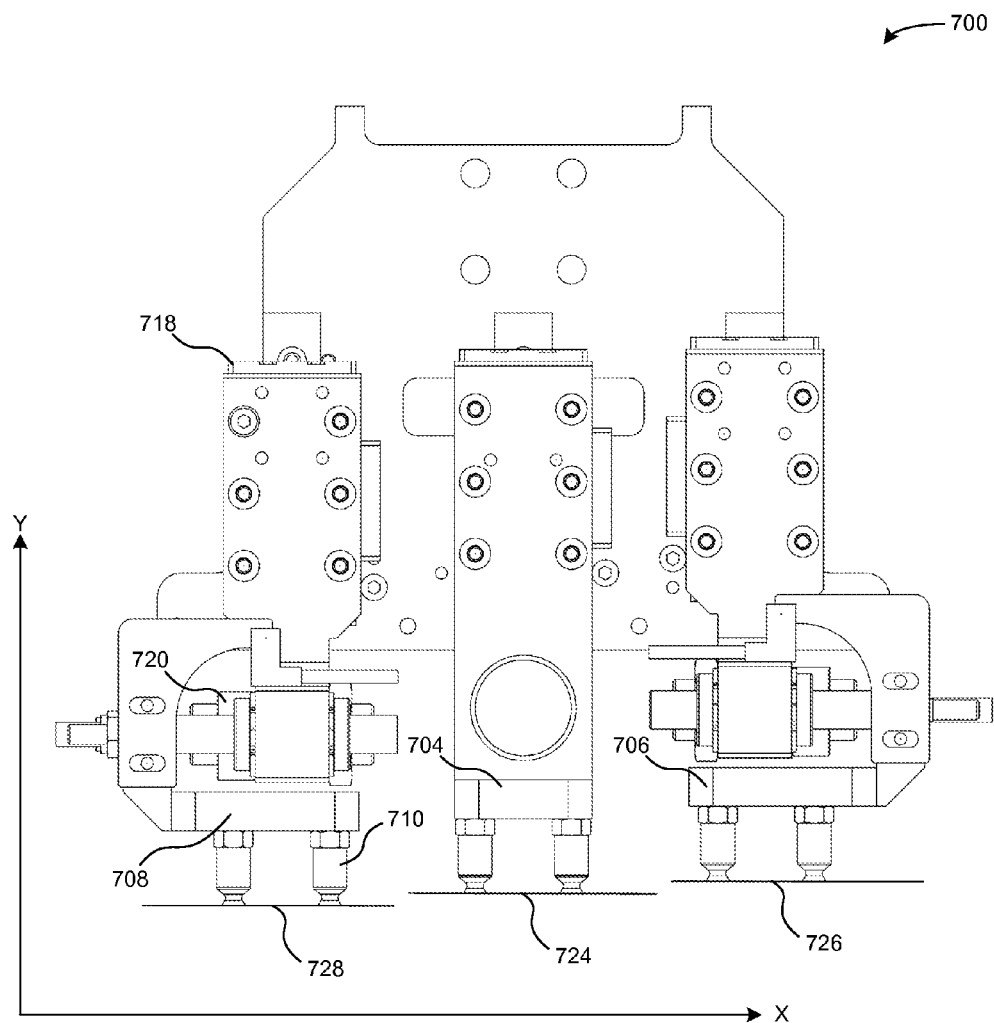
FIG. 7B shows the string-forming system after lifting a set of strips, according to one embodiment of the invention.

FIG. 7B shows string-forming system 700 after lifting a set of strips, according to one embodiment of the invention. Mechanical arm 708 can lift strip 728 to a height that can clear a sidewall of tray 712, mechanical arm 708 can lift strip 727 to a height that may be higher than that of strip 728, and mechanical arm 706 can lift strip 726 to a height that may be higher than that of strip 726.

String-forming system 700 may control the movement of the mechanical arms in a number of ways. In one embodiment, the movement of the mechanical arms along the X axis and Y axis may be controlled by a firmware that can control the movement of each mechanical arm from a first three-dimensional coordinate to a second three-dimensional coordinate. In another embodiment, string-forming system 700 may be retrofitted with a vision system that can measure the distance of each mechanical arm with respect to another mechanical arm, or any other reference point, and may provide near real-time feedback to a control module that can direct the movement of the mechanical arm. In another embodiment, any combination of the above-noted methods may be used, in addition to other methods of movement control, to direct the movement of the mechanical arms and achieve the desired level of precision.

Mechanical arms 704, 706, and 708 can each include an actuator (e.g., actuator 718) that can conform a strip to a predetermined elevation in the Y direction, such as by raising or lowering the strip. In some embodiments, mechanical arm 704 may maintain the strip at a fixed position in the X direction (relative to string-forming system 700), while mechanical arms 706 and 708 can each include another actuator (e.g., actuator 720) that can shift a strip laterally in the X direction. For example, in one embodiment, mechanical arm 708 can include one or more actuators 720 that each can include pneumatic or hydraulic cylinders that may push or pull suction cups 710 in the X direction. In another embodiment, actuators 720 can include an electric motor that can extend or contract a shaft that shifts suction cups in the X direction. Mechanical arms 706 and 708 can also include at least one set of linear ball bushings, which can stabilize the lateral movement of mechanical arms 706 and 708.

In one embodiment, mechanical arms 706 and 708 move toward mechanical arm 704 by a predetermined distance until the strips overlap. The predetermined distance may be about 2 millimeters in one embodiment, which may correspond to the width of the busbar on each strip.

Figure 7C:
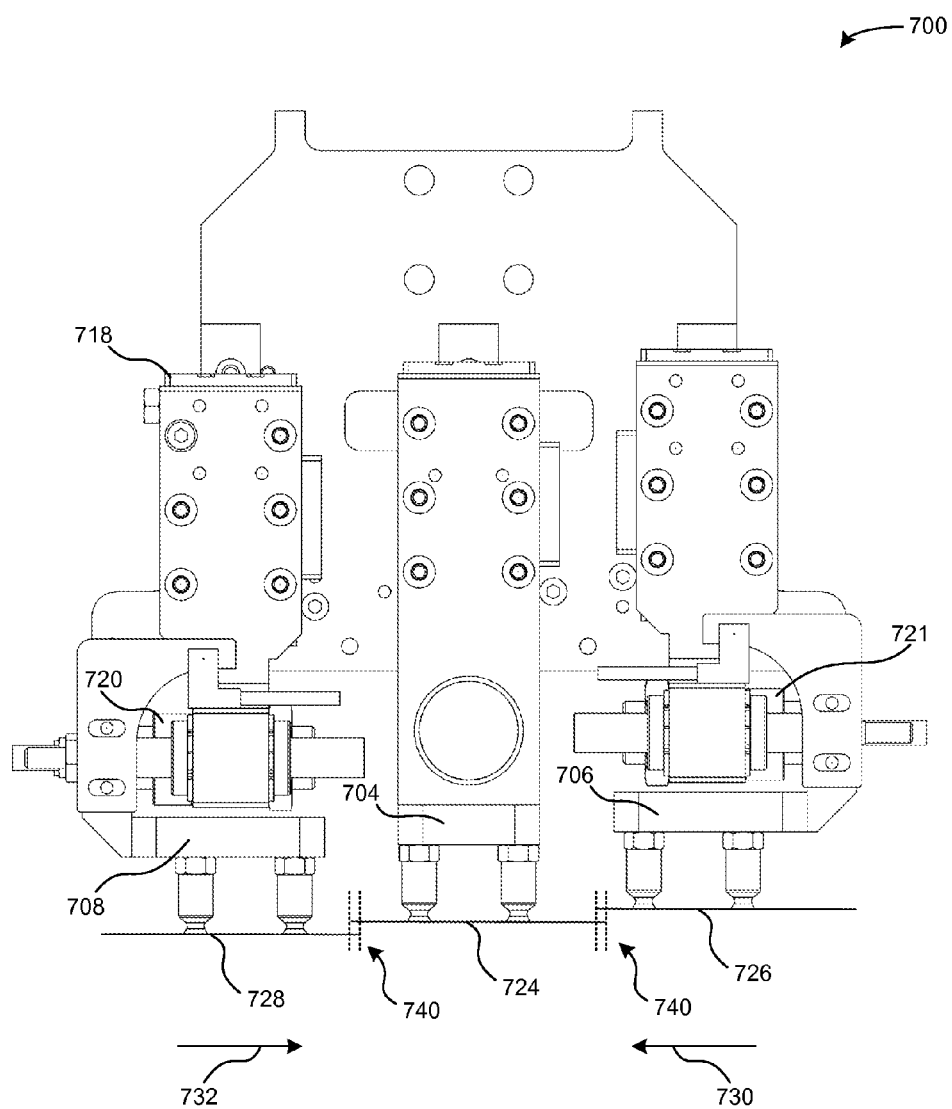
FIG. 7C shows the string-forming system overlapping strips to form a cascaded formation, according to one embodiment of the invention.

FIG. 7C shows string-forming system 700 overlapping strips 724, 726, and 728 to form a cascaded formation, according to one embodiment of the invention. Specifically, string-forming system 700 can activate actuator 720 that can cause mechanical arm 706 to move strip 728 along direction 732 toward strip 724, and can activate another actuator 721 which can cause mechanical arm 706 to move strip 726 along direction 730 toward strip 724.

When the strips are overlapped by the appropriate distance (e.g., distance 740), string-forming system 700 can activate actuators for each of mechanical arms 704, 706, and 708 (e.g., actuator 718) to move, such as by lowering, strips 724, 726, and 728 onto a substantially flat surface. Placing the strips onto the surface can cause the conductive paste on each busbar to bind the busbars of the overlapped strips, which then forms the cascaded strip assembly.

In one variation, string-forming system 700 can form the cascaded strip formation by depositing each individual strip on a location of the flat surface under the mechanical arms. For example, mechanical arm 708 may first place strip 728 on the flat surface to overlap the string assembly on the flat surface, and then mechanical arm 704 may overlap strip 724 over strip 728 on the flat surface by overlap distance 740. Then, mechanical arm 706 may place strip 726 on the flat surface, so that strip 726 can overlap the string assembly on the flat surface by overlap distance 740. In another variation, string-forming system 700 can form the cascaded formation while the strips are elevated over the flat surface (e.g., while in transit from the cleaving table). The mechanical arms of the string-forming system 700 may then shift the strips until achieving the appropriate amount of overlap with respect to the string assembly on the flat surface. String-forming system 700 may then place the cascaded strips onto the flat surface to extend the length of the string.

In one embodiment, string-forming system 700 may have more mechanical arms such that an entire string may be formed during one cycle. In this embodiment, the mechanical arms can lift the strips, create a cascaded formation while the strips are lifted, move the strips to achieve a proper amount of overlap, and place the strips on the flat surface to form a string. In another embodiment, the process may be divided into multiple sub-processes such that two or more strips may be lifted and aligned to form a partial cascaded string, and the partial string may then be lifted and aligned with another partial string to form a complete cascaded string.

Figure 7D:
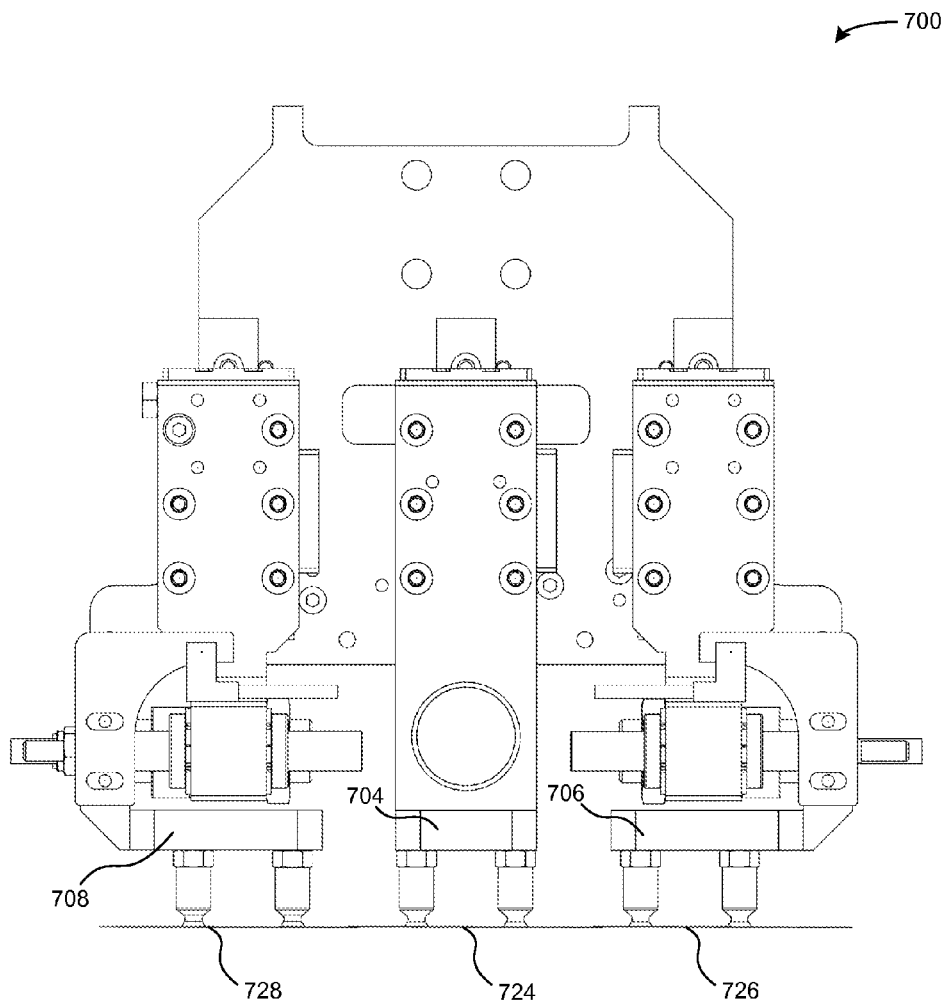
FIG. 7D shows strips in a cascaded formation, according to one embodiment of the invention.

FIG. 7D shows strips 724, 726, and 728 in a cascaded formation, according to one embodiment of the invention. Every three strips can be formed into a cascaded strip assembly, and may be placed on another cascaded strip assembly on the flat surface. Repeating this process can extend a string of cascaded strips.

Figure 8A:
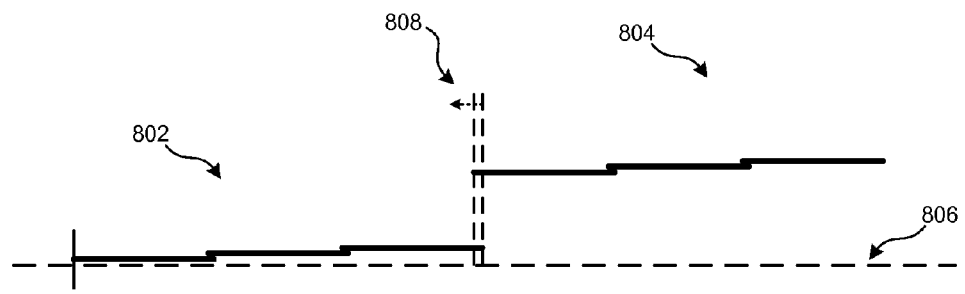
FIG. 8A shows one string assembly that is placed on a flat surface, according to one embodiment of the invention.

FIG. 8A shows one string assembly 802 that is placed on flat surface 806, according to one embodiment of the invention. Another cascaded strip assembly 804 can also be placed on top of string assembly 802 to form a longer string. As shown in FIG. 8A, cascaded strip assembly 804 can also overlap string assembly 802 by overlap distance 808.

Figure 8B:
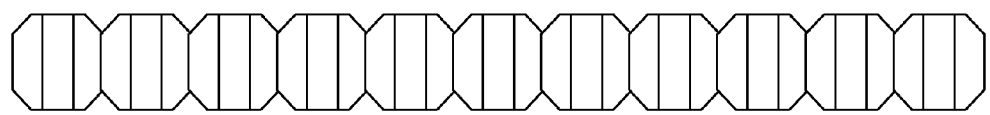
FIG. 8B shows a plurality of strips arranged to form a string assembly, according to one embodiment of the invention.

FIG. 8B shows a plurality of strips arranged to form string assembly 820, according to one embodiment of the invention.

Figure 8C:
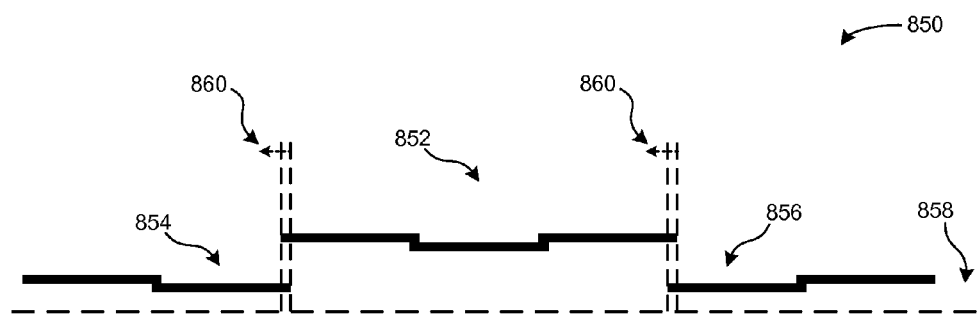
FIG. 8C shows a set of strips with alternating elevations, according to one embodiment of the invention.

FIG. 8C shows a set of strips with alternating elevations, according to one embodiment of the invention. Instead of a continuous stepped formation, the string-forming system may cascade strips 850 so that they may overlap on two edges of one surface. This configuration may need a different conductive grid pattern where each strip can have two busbars on one side to accommodate the alternating-elevation configuration.

For example, cascaded assembly 852 can include three strips, so that two outer strips are bonded to busbars on a top-facing surface of the center strip. In one embodiment, the string-forming system may place cascaded assembly 852 on flat surface 858, so that the two outer strips of cascaded assembly 852 may overlap strip 854 and strip 852 that rest on flat surface 858.

In another embodiment, the string-forming system may build a string by adding an even number of cascaded strips at a time to the string. For example, the string-forming system can arrange two strips in a cascaded assembly whose leading strip has a higher elevation than the trailing strip of the cascaded assembly. The leading strip can include busbars on its downward-facing surface, so that an exposed busbar may be bonded to an upward-facing busbar of the string on the flat surface. Once the cascaded assembly is added to the string, the trailing strip of the cascaded assembly may rest on the flat surface, with an exposed busbar on its upward-facing surface near its trailing edge. The next cascaded assembly may then be bonded to this exposed busbar.

Figure 8D:
FIG. 8D shows a string formed from strips with alternating elevations, according to one embodiment of the invention.

FIG. 8D shows string 870 formed from strips with alternating elevations, according to one embodiment of the invention. One advantage of the alternating-elevation configuration may be that a string may not require a tab at one end. Given that the opposite polarities of the string may be accessible from one side, the need for a tab may be eliminated.

The data structures and code described in this detailed description can typically be stored on a computer-readable storage medium, which may be any device or medium that can store code and/or data for use by a computer system. The computer-readable storage medium can include, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system can perform the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules can perform the methods and processes included within the hardware modules.

The foregoing descriptions of embodiments of the invention have been presented for purposes of illustration and description only. They are not intended to be exhaustive or to limit the invention to the forms disclosed. Accordingly, many modifications and variations may be apparent to practitioners skilled in the art. Additionally, the above disclosure is not intended to limit the invention. The scope of the invention is defined by the appended claims.

What is claimed is:

1. An apparatus, comprising:
a first cell-lifting mechanism operable to lift a first strip from a first platform;
a second cell-lifting mechanism operable to lift, from the first platform, a second strip that follows the first strip on the first platform; and
a control mechanism operable to control the first cell-lifting mechanism and the second cell-lifting mechanism to place a leading edge of the second strip to overlap a trailing edge of the first strip.

2. The apparatus of claim 1, wherein the control mechanism is operable to control the first cell-lifting mechanism and the second cell-lifting mechanism to place the leading edge of the second strip to overlap the trailing edge of the first strip by approximately two millimeters.

3. The apparatus of claim 1, wherein the control mechanism is further operable to control the first cell-lifting mechanism and the second cell-lifting mechanism to place the first strip and the second strip on the second platform, wherein a leading edge of the first strip overlaps a trailing edge of a third strip resting on the second platform to extend a string comprising the third strip.

4. The apparatus of claim 1, wherein the first and second cell-lifting mechanisms each comprise at least one air-suction mechanism operable to maintain a suction-hold on a strip.

5. The apparatus of claim 1, wherein the first cell-lifting mechanism lifts the first strip to a first elevation, and wherein the second cell-lifting mechanism lifts the second strip to a second elevation higher than the first elevation.

6. The apparatus of claim 1, wherein the control mechanism is further operable to rest the first and second strips on the second platform, with the leading edge of the second strip placed above the trailing edge of the first strip.

7. The apparatus of claim 1, wherein the second cell-lifting mechanism is stationary, and wherein the first cell-lifting mechanism moves toward the second cell-lifting mechanism to place the first strip under the second strip.

8. The apparatus of claim 1, wherein the first cell-lifting mechanism is stationary, and wherein the second cell-lifting mechanism moves toward the first cell-lifting mechanism to place the second strip above the first strip.

9. The apparatus of claim 1, wherein the first platform and the second platform correspond to a surface area of a conveyer belt.

10. The apparatus of claim 1, wherein the first platform comprises one or more solar cell trays.

11. A system for cascading solar cells, the system comprising:
a first mechanical arm configured to move at least in a first direction, wherein the first mechanical arm includes at least a suction-cup at one end and configured to apply a holding force to a surface; and
a second mechanical arm configured to move at least in the first direction, wherein second the mechanical arm includes at least a suction-cup at one end and configured to apply a holding force to a surface;
wherein the first mechanical arm lifts a first solar cell from a surface, the second mechanical arm lifts a second solar cell from the surface, and the first mechanical arm and the second mechanical arm align the second solar cell to partially overlap the first solar cell while being lifted, and wherein the first mechanical arm and the second mechanical arm place the first solar cell and the second solar cell on the surface while the second solar cell partially overlaps the first solar cell.

12. The system of claim 11, wherein when the first mechanical arm and the second mechanical arm place the first solar cell and the second solar cell on the surface, the first solar cell partially overlaps a third solar cell resting on the second surface to extend a string comprising the third solar cell.

13. The system of claim 11, wherein the second mechanical arm is further configured to move in a horizontal direction, and wherein the second mechanical arm lifts the second solar cell in a vertical direction to a height higher than the first solar cell, and moves the second solar cell horizontally toward the first mechanical arm holding the first solar cell.

14. The system of claim 11, wherein the first direction is substantially vertical;
wherein the first mechanical arm is further configured to move in a substantially horizontal direction; and
wherein the first mechanical arm lifts the first solar cell in the first direction to a height lower than the second solar cell, and moves the first solar cell substantially horizontally toward the second mechanical arm holding the second solar cell.

15. The system of claim 11, wherein the system further comprises a measurement module that measures the movement of the first mechanical arm and the second mechanical arm.

16. A method, comprising:
activating, by a controller, a first lifting actuator of a first cell-lifting mechanism operable to lift a first strip from a first platform;
activating a second lifting actuator of a second cell-lifting mechanism operable to lift, from the first platform, a second strip that follows the first strip on the first platform; and
activating a first shifting actuator of the first cell-lifting mechanism or a second shifting actuator of the second cell-lifting mechanism to place a leading edge of the second strip to overlap a trailing edge of the first strip.

17. The method of claim 16, further comprising;
controlling actuators of the first cell-lifting mechanism and the second cell-lifting mechanism to place the first strip and the second strip on the second platform, wherein a leading edge of the first strip overlaps a trailing edge of a third strip resting on the second platform to extend a string comprising the third strip.

18. The method of claim 16, further comprising maintaining a suction-hold on a strip via a suction cup within the first or second cell-lifting mechanism.

19. The method of claim 16, further comprising lifting the first strip to a first elevation by the first cell-lifting mechanism and lifting the second strip to a second elevation by the second cell-lifting mechanism.

20. The method of claim 16, further comprising:
   activating the first and second lifting actuators to rest the first and second strips on the second platform, with the leading edge of the second strip placed above the trailing edge of the first strip.

* * * * *